United States Patent
Gao et al.

(10) Patent No.: US 12,044,760 B2
(45) Date of Patent: Jul. 23, 2024

(54) MAGNETIC RESONANCE IMAGING SYSTEM AND METHOD, AND COMPUTER-READABLE STORAGE MEDIUM

(71) Applicant: GE Precision Healthcare LLC, Wauwatosa, WI (US)

(72) Inventors: Lei Gao, Beijing (CN); Hua Li, Waukesha, WI (US); Xuan Liu, Beijing (CN); Yongchuan Lai, Beijing (CN); Jiabin Yao, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 96 days.

(21) Appl. No.: 18/056,574

(22) Filed: Nov. 17, 2022

(65) Prior Publication Data

US 2023/0168325 A1 Jun. 1, 2023

(30) Foreign Application Priority Data

Nov. 30, 2021 (CN) .......................... 202111443250.9

(51) Int. Cl.
*G01R 33/48* (2006.01)
*G01R 33/385* (2006.01)

(52) U.S. Cl.
CPC ....... *G01R 33/4818* (2013.01); *G01R 33/385* (2013.01)

(58) Field of Classification Search
CPC ............. G01R 33/4818; G01R 33/385; G01R 33/5611; G01R 33/56554; G01R 33/56518; G01R 33/5616; G01R 33/56341

See application file for complete search history.

(56) References Cited

U.S. PATENT DOCUMENTS

| 11,119,175 | B2 | 9/2021 | Gao | |
|---|---|---|---|---|
| 2018/0120403 | A1* | 5/2018 | Liu | G01R 33/56341 |
| 2023/0168324 | A1* | 6/2023 | Gao | G01R 33/5611 |
| | | | | 324/309 |

* cited by examiner

*Primary Examiner* — G. M. A Hyder (57) ABSTRACT

A magnetic resonance imaging system and method, and a computer-readable storage medium are provided. The magnetic resonance imaging method includes: acquiring a plurality of k-space data sets by using a plurality of imaging sequences, each imaging sequence comprising a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values; respectively reconstructing magnetic resonance images from the respective k-space data sets; and averaging amplitudes of the magnetic resonance images to generate a magnetic resonance image of an average amplitude.

14 Claims, 6 Drawing Sheets

MAGNETIC RESONANCE IMAGING SYSTEM AND METHOD, AND COMPUTER-READABLE STORAGE MEDIUM

CROSS REFERENCE

The present application claims priority and benefit of Chinese Patent Application No. 202111443250.9 filed on Nov. 30, 2021, which is incorporated herein by reference in its entirety.

TECHNICAL FIELD

The present invention relates to the field of medical imaging, and in particular to a magnetic resonance imaging (MM) system and method and a computer-readable storage medium.

BACKGROUND

Conventional magnetic resonance echo planar imaging (EPI) is a fast acquisition imaging technology. An entire image may be formed by a plurality of echo signals generated after a single radio frequency (RF) is excited, and therefore fast imaging can be realized. However, by using such imaging technology, a Nyquist artifact is prone to occur, which may be caused by reasons such as an eddy current, gradient coil heating, gradient delay, and the like. In addition, due to simultaneous use of multi-channel acceptance and parallel acquisition technologies in the EPI, an acceleration artifact occurs in an edge region of an image. Some methods of suppressing the Nyquist artifact or the acceleration artifact have been proposed in the prior art, but it is difficult to suppress both different types of artifacts at the same time, and a suppression effect on the artifact also requires to be further improved.

SUMMARY

Provided in an aspect of the present invention is a magnetic resonance imaging method, comprising: acquiring a plurality of k-space data sets by using a plurality of imaging sequences, each imaging sequence comprising a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values. The method also includes respectively reconstructing magnetic resonance images from the respective k-space data sets; and averaging amplitudes of the magnetic resonance images to generate a magnetic resonance image of an average amplitude.

In another aspect, the standard area difference is 2/N of an area of any phase encoding gradient, where N is the number of the imaging sequences.

In another aspect, the number of the imaging sequences is greater than 2.

In another aspect, each imaging sequence further comprises a radio-frequency excitation pulse, a radio-frequency refocusing pulse, and a diffusion gradient pulse, the diffusion gradient pulse comprises a phase-shifted gradient pulse and a rephasing gradient pulse, the phase-shifted gradient pulse and the rephasing gradient pulse are symmetrically applied before and after the radio-frequency refocusing pulse respectively, and the pre-phase-dispersion gradient pulse are applied after the rephasing gradient pulse.

In another aspect, each imaging sequence further comprises a plurality of frequency encoding gradients, directions of the plurality of frequency encoding gradients are alternately reversed, and the plurality of phase encoding gradients are respectively applied when the directions of the plurality of frequency encoding gradients are reversed.

Further provided in another aspect of the present invention is a magnetic resonance imaging method, comprising: acquiring a plurality of k-space data sets by using a plurality of imaging sequences, each imaging sequence comprising an echo planar imaging (EPI) sequence portion and a preparation portion applied before the echo planar imaging sequence, wherein echoes of the plurality of k-space data sets have a standard phase offset therebetween when ordered according to phase values. The method also includes respectively reconstructing magnetic resonance images from the respective k-space data sets; and averaging amplitudes of the magnetic resonance images to generate a magnetic resonance image of an average amplitude.

In another aspect, the standard phase offset is $2\pi/N$, where N is the number of the k-space data sets.

In another aspect, the number of the k-space data sets is greater than 2.

In another aspect, the preparation sequence comprises a spin-echo sequence, a gradient echo sequence, a diffusion-weighted sequence, or a spin-echo diffusion-weighted sequence.

Further provided in another aspect of the present invention is a computer-readable storage medium, the computer-readable storage medium comprising a stored computer program, wherein the magnetic resonance imaging method according to any one of the above aspects is performed when the computer program is run.

Further provided in another aspect of the present invention is a magnetic resonance imaging (MRI) system, comprising: a gradient coil, configured to generate an encoding gradient; a radio frequency (RF) coil, configured to generate an RF pulse; and a processor, connected to the gradient coil and the RF coil. The processor is configured to instruct the gradient coil and the RF coil to generate a plurality of imaging pulse sequences to acquire a plurality of k-space data sets, each imaging sequence comprising a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values. The processor is further configured to respectively reconstruct magnetic resonance images from the respective k-space data sets; and average amplitudes of the magnetic resonance images to generate a magnetic resonance image of an average amplitude.

It should be understood that the brief description above is provided to introduce, in simplified form, some concepts that will be further described in the detailed description. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

The accompanying drawings show components, systems, and methods described in the magnetic resonance imaging method and system. The accompanying drawings, along with the following description, show and explain structural principles, methods, and principles described in the specification. In the accompanying drawings, a thickness and a size of a component may be enlarged or otherwise modified for clarity. Structures, materials, or operations known in the art are not shown or described in detail to avoid obscuring the described components, systems, and methods.

DETAILED DESCRIPTION

Specific implementations of the present invention will be described below. It should be noted that in the specific description of these embodiments, for the sake of brevity and conciseness, this specification may not describe all features of the actual implementations in detail. It should be understood that in the actual implementation process of any implementations, just as in the process of any engineering project or design project, a variety of specific decisions are often made to achieve specific goals of the developer and to meet system-related or business-related constraints, which may also vary from one implementation to another. Furthermore, it should also be understood that although efforts made in such development processes may be complex and tedious, for those of ordinary skill in the art related to the content disclosed in the present invention, some design, manufacture or production changes based on the technical content disclosed in the present disclosure are only common technical means, and should not be construed as insufficient content of the present disclosure.

Unless otherwise defined, the technical or scientific terms used in the claims and the description are as they are usually understood by those of ordinary skill in the art to which the present invention pertains. Terms such as "first," "second," and similar terms used in this specification and claims do not denote any order, quantity, or importance, but are only intended to distinguish different constituents. The terms "one" or "a/an" and similar terms do not denote a limitation of quantity, but rather the presence of at least one. The terms "include" or "comprise" and similar terms mean that an element or article preceding the term "include" or "comprise" encompasses elements or articles and their equivalent elements listed after "include" or "comprise," and does not exclude other elements or articles. The terms "connect" or "connected" and similar words are not limited to physical or mechanical connections, and are not limited to direct or indirect connections. Furthermore, it should be understood that a reference to "one embodiment" or "an embodiment" of the present disclosure is not intended to be interpreted as excluding existence of an additional implementation that also includes the recited feature.

Referring to the accompanying drawings, the present disclosure describes a magnetic resonance system and a magnetic resonance imaging method through which a Nyquist artifact and an acceleration artifact can be suppressed. A plurality of k-space data are acquired by using a plurality of imaging sequences, magnetic resonance images are respectively reconstructed from the respective k-space data sets, and amplitudes of the magnetic resonance images are averaged to generate a magnetic resonance image of an average amplitude. Each imaging sequence includes a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values. In this way, artifacts in echoes of the plurality of imaging pulse sequence are attenuated such that a Nyquist artifact and an acceleration artifact are suppressed in an average MR image. In addition, because an amplitude average is used, signal intensity does not decrease, and thus good signal-to-noise ratio (SNR) is achieved.

Figure 1:
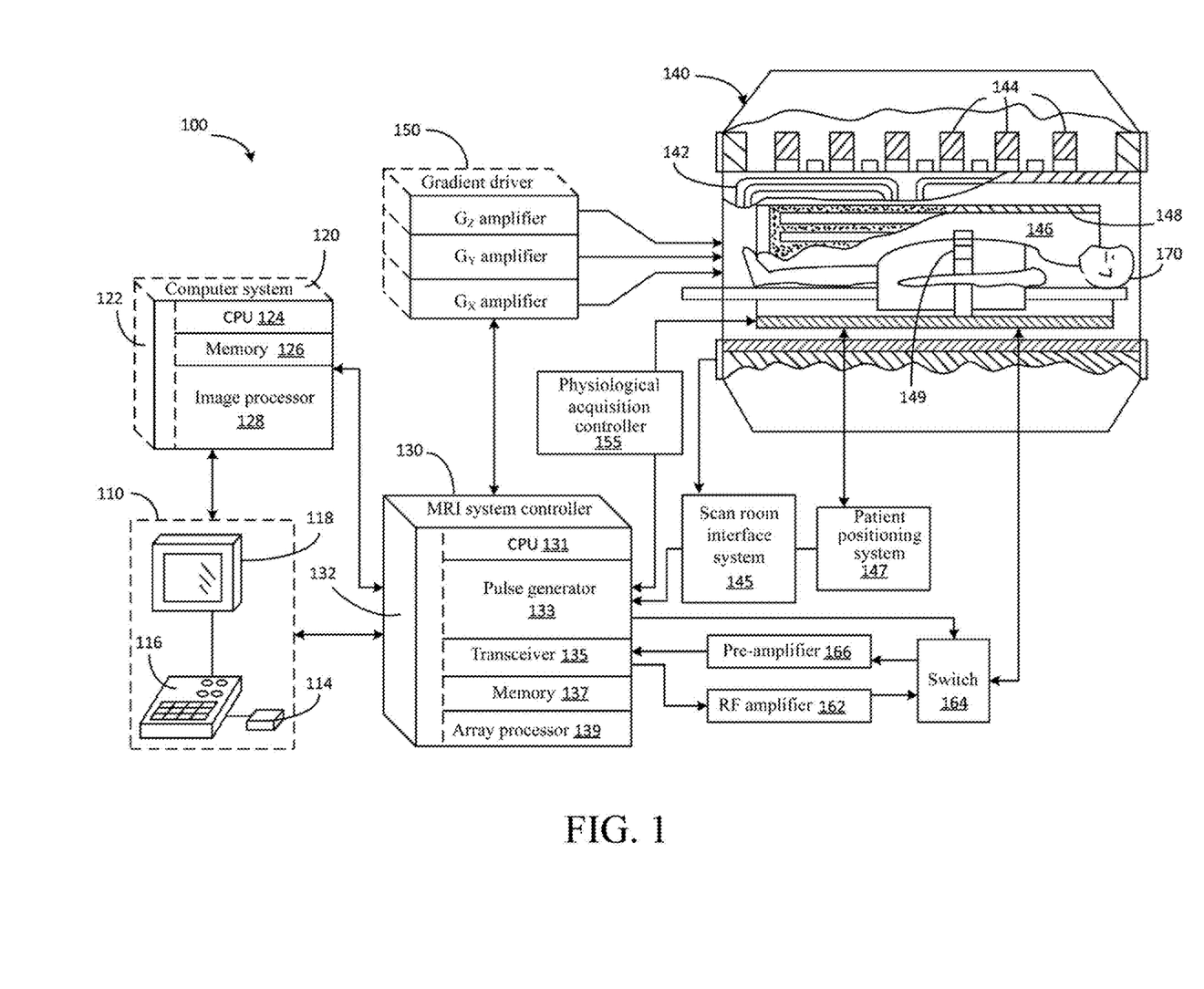
FIG. 1 is a schematic diagram of a magnetic resonance imaging (MRI) system according to an exemplary embodiment.

Referring to FIG. 1, a schematic diagram of an exemplary MRI (magnetic resonance imaging) system 100 according to some embodiments is shown. An operation of the MRI system 100 is controlled by an operator workstation 110. The operator workstation 110 includes an input device 114, a control panel 116, and a display 118. The input device 114 may be a joystick, a keyboard, a mouse, a trackball, a touch-activated screen, a voice control, or any similar or equivalent input device. The control panel 116 may include a keyboard, a touch-activated screen, a voice control, a button, a slider, or any similar or equivalent control device. The operator workstation 110 is coupled to and in communication with a computer system 120 that enables an operator to control generation and viewing of images on the display 118. The computer system 120 includes various components that communicate with each other via an electrical and/or data connection module 122. The connection module 122 may be a direct wired connection, a fiber optic connection, a wireless communication link, etc. The computer system 120 may include a central processing unit (CPU) 124, a memory 126, and an image processor 128. In some implementations, the image processor 128 may be replaced by image processing functions implemented in a CPU 124. The computer system 120 may be connected to an archival media device, a persistent or backup storage, or a network. The computer system 120 may be coupled to and in communication with a separate MRI system controller 130.

The MRI system controller 130 includes a set of components that communicate with each other via an electrical and/or data connection module 132. The connection module 132 may be a direct wired connection, a fiber optic connection, a wireless communication link, etc. The MM system controller 130 may include a CPU 131, a sequence pulse generator 133 in communication with the operator workstation 110, a transceiver (or an RF transceiver) 135, a memory 137, and an array processor 139. In some implementations, the sequence pulse generator 133 may be integrated into a resonance assembly 140 of the MRI system 100. The MRI system controller 130 may receive commands from the operator workstation 110 to indicate an MRI scan sequence to be executed during an MM scan. The MM system controller 130 is further coupled to and in communication with a gradient driver system 150, which is coupled to a gradient coil assembly 142 to generate a magnetic field gradient during the MRI scan.

The sequence pulse generator 133 may further receive data from a physiological acquisition controller 155, which receives signals from a number of different sensors, such as electrocardiogram (ECG) signals from electrodes attached to a patient, which are connected to the subject or patient 170 undergoing an MRI scan. The sequence pulse generator 133 is coupled to and in communication with a scan room interface system 145 that receives signals from various sensors associated with the state of the resonance assembly 140. The scan room interface system 145 is further coupled to and in communication with a patient positioning system 147 that sends and receives signals to control movement of a patient table to a desired position to perform the MRI scan.

The MRI system controller 130 provides gradient waveforms to the gradient driver system 150, and the gradient driver system includes $G_x$, $G_y$, and $G_z$ amplifiers, etc. Each $G_x$, $G_y$, and $G_z$ gradient amplifier excites a corresponding gradient coil in the gradient coil assembly 142 so as to generate a magnetic field gradient used to spatially encode an MR signal during the MM scan. The gradient coil assembly 142 is disposed within the resonance assembly 140, and the resonance assembly further includes a superconducting magnet having a superconducting coil 144 that, in operation, provides a static uniform longitudinal magnetic field $B_0$ throughout a cylindrical imaging volume 146. The resonance assembly 140 further includes an RF body coil 148, which, in operation, provides a lateral magnetic field $B_1$ that is substantially perpendicular to $B_0$ throughout the cylindrical imaging volume 146. The resonance assembly 140 may further include an RF surface coil 149 for imaging different anatomical structures of the patient undergoing the MRI scan. The RF body coil 148 and the RF surface coil 149 may be configured to operate in a transmit and receive mode, a transmit mode, or a receive mode.

The subject or patient 170 of the MRI scan may be positioned within the cylindrical imaging volume 146 of the resonance assembly 140. A transceiver 135 in the MRI system controller 130 generates RF excitation pulses that are amplified by an RF amplifier 162 and provided to the RF body coil 148 through a transmit/receive switch (T/R switch) 164.

As described above, the RF body coil 148 and the RF surface coil 149 may be used to transmit RF excitation pulses and/or receive resulting MR signals from the patient undergoing the MM scan. The MR signals emitted by excited nuclei in the patient of the MRI scan may be sensed and received by the RF body coil 148 or the RF surface coil 149 and sent back to a preamplifier 166 through the T/R switch 164. The T/R switch 164 may be controlled by a signal from the sequence pulse generator 133 to electrically connect the RF amplifier 162 to the RF body coil 148 in the transmit mode and to connect the preamplifier 166 to the RF body coil 148 in the receive mode. The T/R switch 164 may further enable the RF surface coil 149 to be used in the transmit mode or the receive mode.

In some implementations, the MR signals sensed and received by the RF body coil 148 or the RF surface coil 149 and amplified by the preamplifier 166 are stored in a memory 137 for post-processing as a raw k-space data array. A reconstructed magnetic resonance image may be obtained by transforming/processing the stored raw k-space data.

In some implementations, the MR signals sensed and received by the RF body coil 148 or the RF surface coil 149 and amplified by the preamplifier 166 are demodulated, filtered, and digitized in a receiving portion of transceiver 135, and transmitted to the memory 137 in the MRI system controller 130. For each image to be reconstructed, the data is rearranged into separate k-space data arrays, and each of these separate k-space data arrays is inputted to the array processor 139, which is operated to convert the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term storage, or may be further processed by the image processor 128 and transmitted to the operator workstation 110 for presentation on the display 118.

In various implementations, components of the computer system 120 and the MRI system controller 130 may be implemented on the same computer system or on a plurality of computer systems. It should be understood that the MRI system 100 shown in FIG. 1 is intended for illustration. Suitable MRI systems may include more, fewer, and/or different components.

The MRI system controller 130 and the image processor 128 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the magnetic resonance imaging method according to the embodiments of the present invention. The storage medium may include, for example, a ROM, a floppy disk, a hard disk, an optical disk, a magneto-optical disk, a CD-ROM, or a non-volatile memory card.

The "imaging sequence" refers to a combination of pulses having specific amplitudes, widths, directions, and time sequences and applied when a magnetic resonance imaging scan is executed. The pulses may typically include, for example, a radio-frequency pulse and a gradient pulse. The radio-frequency pulses may include, for example, radio-frequency excitation pulses, radio-frequency refocusing pulses, inverse recovery pulses, etc. The gradient pulses may include, for example, the aforementioned gradient pulse used for slice selection, gradient pulse used for phase encoding, gradient pulse used for frequency encoding, gradient pulse used for phase offset (phase shift), gradient pulse used for discrete phase (phase dispersion), etc.

Typically, a plurality of scanning sequences can be pre-set in the magnetic resonance system, so that the sequence suitable for clinical detection requirements can be selected. The clinical detection requirements may include, for example, an imaging site, an imaging function, an imaging effect, and the like.

For example, a magnetic resonance imaging sequence capable of simultaneously suppressing the Nyquist artifact and the acceleration artifact in the embodiments of the present invention may be pre-set. The imaging sequence may include a preparation sequence and an echo planar imaging (EPI) sequence, wherein the preparation sequence is applied before the EPI sequence. Conventional EPI is an accelerated imaging technology. An entire image may be formed by a plurality of echo signals generated after a single radio frequency (RF) is excited. In the k-space, one echo is generated along each phase line of the k-space. In k-space acquisition, two adjacent echoes, e.g., a forward echo and a reverse echo, are acquired in opposite directions. An eddy current, poor magnetic field uniformity, gradient coil heating, gradient system delay, etc. due to rapid gradient changes are likely to prevent the forward echo and the reverse echo from being perfect mirror images with each other, and thus to introduce an artifact into the image during reconstruction. For example, a delay started from a first echo propagates to all subsequent echoes, resulting in a timing difference between peaks of an odd echo and an even echo. When a Fourier transform is performed, a phase error causes signal intensity to be shifted in a phase encoding direction of half of the image, which is referred to as a Nyquist ghost. In addition, because a plurality of echoes are quickly acquired in the EPI, a parallel acceleration artifact due to wrapping occurs in an edge region of the image.

Figure 2:
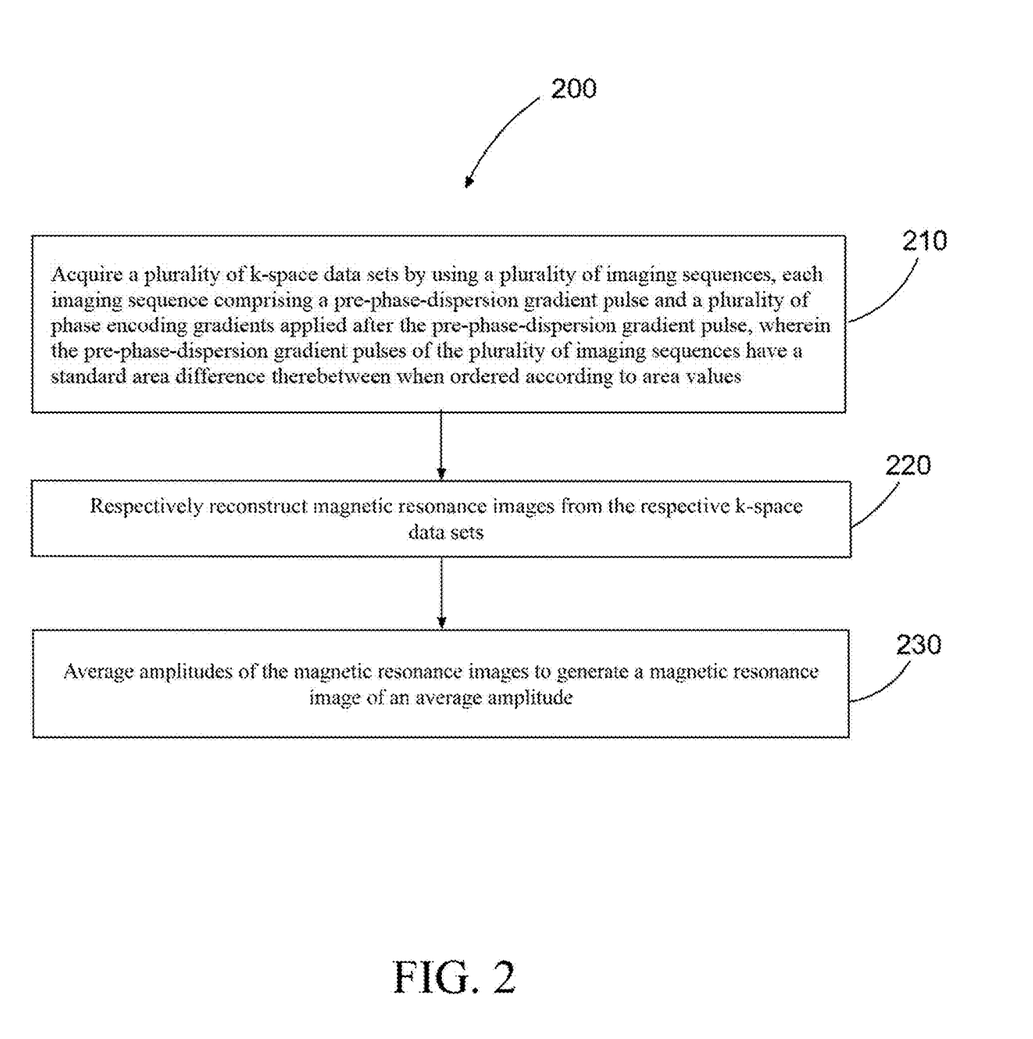
FIG. 2 is a flowchart of a magnetic resonance imaging method according to an exemplary embodiment of the present invention.

FIG. 2 shows a flowchart of a magnetic resonance imaging method 200 according to an exemplary embodiment.

In step 210, a plurality of k-space data sets is acquired by using a plurality of imaging pulse sequences.

In step 220, magnetic resonance images are respectively reconstructed from the respective k-space data sets.

In step 230, amplitudes of the reconstructed magnetic resonance images are averaged to generate a magnetic resonance image of an average amplitude.

Figure 3:
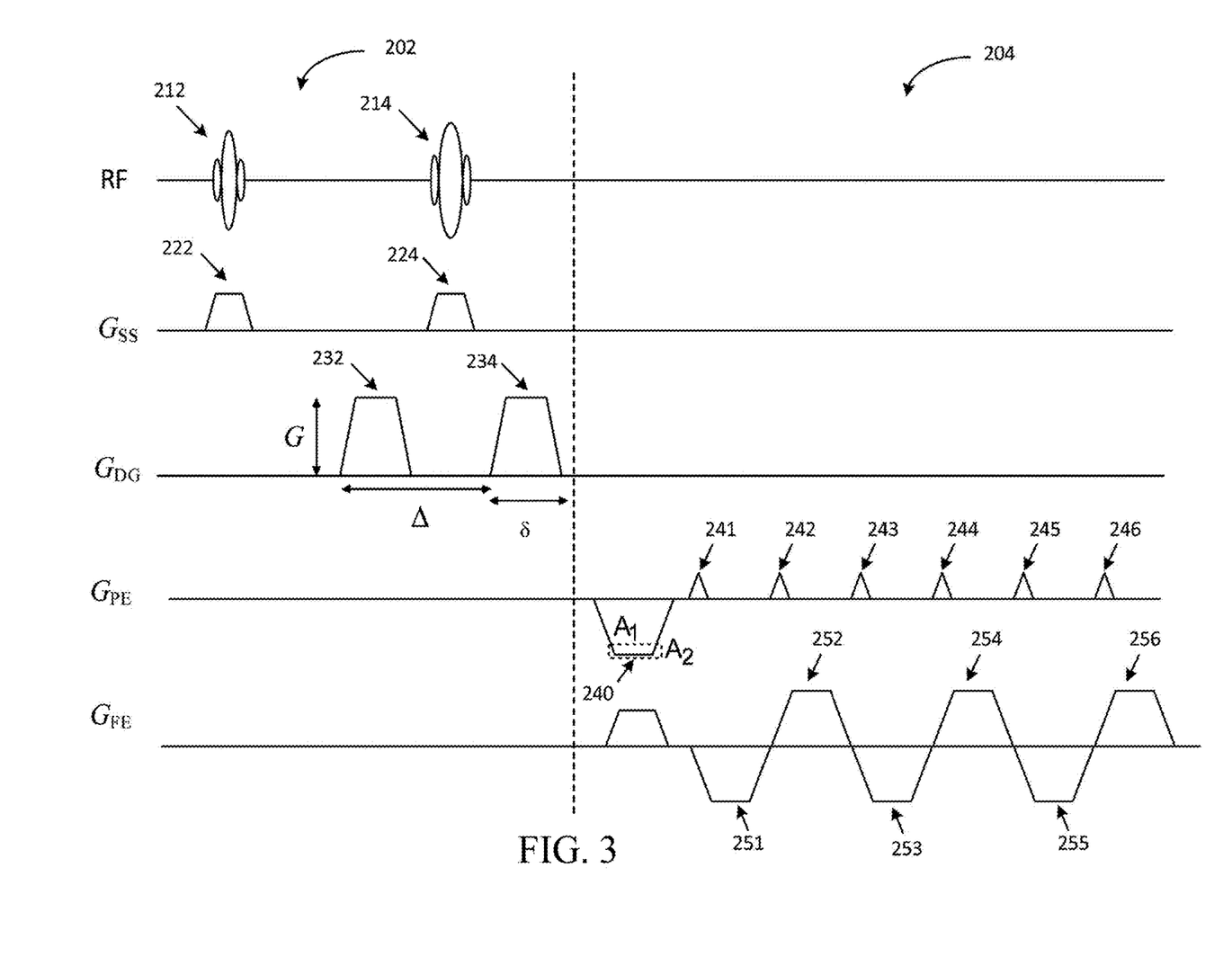
FIG. 3 is a schematic diagram of an exemplary imaging sequence used in the method shown in FIG. 2.

FIG. 3 shows a schematic diagram of an exemplary imaging sequence 300 used in the method 200. Each imaging sequence includes an EPI sequence 204 and a preparation sequence 202 applied before the EPI sequence. As an example, the preparation sequence 202 may include a spin-echo diffusion-weighted (SE-DWI) sequence. For example, it may include a sequentially applied radio-frequency (RF) excitation pulse 212 and a radio-frequency refocusing pulse 214, slice selection gradient (G---$_{SS}$) pulses 222 and 224 respectively applied with the radio-frequency excitation pulse 212 and the radio-frequency refocusing pulse 214.

Furthermore, the preparation sequence 202 may further include a diffusion gradient (G---$_{DG}$) pulse for proton diffusion weighting. A diffusion-weighted technology may be applied to diagnosis of tissue functions in various organs (e.g., brain, cartilage, and liver) and various applications (e.g., pathology, oncology). Diffusion refers to a random movement of a molecule in a system. In a biological tissue, diffusion of water molecule forms a pattern based on a tissue structure and property. In some disease states, a diffusion pattern may be disturbed, and, in a region affected by a disease, an amount of diffusion may change. Therefore, an abnormality of a tissue may be detected by studying changes of the diffusion. A diffusion-weighted magnetic resonance imaging technology uses the diffusion of water molecule to indicate internal physiology. Contrast of a diffusion-weighted image reflects a difference of diffusion rate between tissues. The diffusion-weighted technology is particularly useful in a case where a conventional MIll sequence (e.g., T2 weighted imaging) does not show a significant change in the image. For example, in a pathological condition similar to a stroke generated by ischemia, a signal intensity on T2 does not change until at least 8 hours after onset of the stroke. In another aspect, the DWI may display a change in a brain within 30 minutes after the onset of the stroke, and display a distinct signal difference within one hour of the onset.

This diffusion gradient pulse includes a phase-shifted gradient pulse 232 and a redirecting gradient pulse 234. The phase-shifted gradient pulse 232 and the rephasing gradient pulse 234 are applied symmetrically on both sides of (before and after) a radio-frequency refocusing pulse 214 respectively.

The radio-frequency excitation pulse 212 may be, for example, a 90-degree radio-frequency pulse, and the radio-frequency refocusing pulse 214 may be a 180-degree radio-frequency pulse, both of which may be generated by a transmit coil (e.g., an RF body coil 148 in FIG. 1). In some embodiments, the radio-frequency excitation pulse 212 itself may be selectively tuned to only excite a water proton. Slice selection gradient pulses 222 and 224, and diffusion gradient pulses 232 and 234 may be generated by a gradient coil assembly (e.g., a gradient coil assembly 142 in FIG. 1).

The phase-shifted gradient pulse 232 is used for introducing a phase shift into a proton according to a position of the proton, while the rephasing gradient pulse 234 reverses the foregoing change made by the phase-shifted gradient pulse 232. A phase of a fixed spin is not affected by the diffusion gradient pulse because any phase accumulation from the phase-shifted gradient pulse 232 is reversed by the rephasing gradient pulse 234. However, a diffusion spin moves to a different position between the phase-shifted gradient pulse 232 and the rephasing gradient pulse 234, resulting in a loss of a phase and a signal. That is, if the proton is moved, the rephasing gradient pulse 234 cannot fully eliminate the phase shift caused by the phase-shifted gradient pulse 232. Therefore, there is signal attenuation. The signal attenuation from a net motion of the proton is given by a Stejskal-Tanner formula:

$$S(b) = S_0 e^{-bD} \tag{1}$$

S(b) is a signal received when a particular diffusion gradient pulse pair is applied, $S_0$ is a signal intensity without any diffusion gradient, e is a constant, D is a diffusion or apparent diffusion coefficient (ADC), and b is a diffusion weighting for the particular diffusion gradient pulse pair. A value of b may be controlled by manipulating intensity, duration, and spacing of the diffusion gradient pulse pairs 232 and 234. Specifically, the value of b is given by as follows:

$$b = \gamma^2 G^2 \delta^2 \left( \Delta - \frac{\delta}{3} \right). \tag{2}$$

$\gamma$ is a gyromagnetic ratio of a hydrogen proton and is a constant, G is an amplitude of the diffusion gradient pulse, $\delta$ is a duration of the diffusion gradient pulse, and $\Delta$ is time between application of two diffusion gradient pulses. In a clinical application, a sequence is usually set for providing a plurality of images having ranges of a diffusion direction and b-value, and sometimes calculating ADC mapping. For example, several diffusion-weighted (DW) images having different b-values may be obtained by changing configuration of the diffusion gradient pulse pair. At a higher b-value, a diffusion effect is more significant in an image and a tissue having high diffusion, as shown in a low signal region in the image, while a tissue having limited diffusion is shown in a high signal region.

Using the SE-DWI sequence as the preparation sequence is merely an example of application. In another example, the preparation sequence 202 may be another type of sequence, such as a gradient echo (GRE) sequence, an SE sequence, a DWI sequence, and the like.

After the preparation sequence 202 is applied, the EPI sequence 204 may be executed immediately to perform fast acquisition of k-space data. Fast image acquisition may minimize an effect of an overall motion on the image. The EPI sequence 204 includes a pre-phase-dispersion gradient pulse 240, and a plurality of phase encoding gradients ($G_{PE}$) pulses (241, 242, 243, . . . ) and a plurality of frequency encoding gradients ($G_{FE}$) pulses (251, 252, 253, . . . ) applied after the pre-phase-dispersion gradient pulse 240. The pre-phase-dispersion gradient pulse 240, the plurality of phase encoding gradient pulses, and the plurality of frequency encoding gradient pulses may be generated by a gradient coil (e.g., the gradient coil assembly 142 in FIG. 1).

As shown in FIG. 3, after the pre-phase-dispersion gradient pulse 240 ends, there are a plurality of small "spikes" at each position where the frequency encoding gradient pulse is reversed, i.e., the foregoing plurality of phase encoding gradient pulses. The plurality of phase encoding gradient pulses rapidly oscillates to generate a plurality of gradient echoes. Directions of the plurality of frequency encoding gradient pulses are alternately reversed, and the plurality of phase encoding gradient pulses are respectively applied when the directions of the plurality of frequency encoding gradient pulses are reversed. For example, a spike 241 applies at the beginning of a negative frequency encoding (or readout) gradient pulse 251. A spike 242 is placed at a reversal from a negative readout gradient 251 to a positive readout gradient 252, a spike 243 is placed at a reversal from the positive readout gradient 252 to a negative readout gradient 253, and so on. The spike has a constant size and each adds further phase encoding to a previous spike.

In each imaging sequence, phases of a plurality of corresponding gradient echoes can be controlled by setting an area of the pre-phase-dispersion gradient 240. The areas of the pre-phase-dispersion gradient pulses 240 of the plurality of imaging sequences used in the magnetic resonance imaging method in the embodiments of the present invention are different. Specifically, the pre-phase-dispersion gradient pulses 240 of the plurality of imaging sequences have standard area differences therebetween when ordered according to area values. In addition, in the embodiments of the present invention, an execution order of the plurality of imaging sequences may be the same as or different from an order according to the area values. That is, the plurality of imaging sequences may be performed sequentially. The area of the pre-phase-dispersion gradient pulse 240 gradually increases or decreases by a fixed value according to an execution order of a sequence, and the plurality of imaging sequences may also be performed sequentially, wherein the area value of the pre-phase-dispersion gradient pulse 240 does not sequentially increase or decrease according to the sequence. The area value of the pre-phase-dispersion gradient pulse 40 is changed in such a way that when a relatively large number of k-space data sets are acquired, both Nyquist artifacts and acceleration artifacts in an average amplitude image acquired on the basis of magnetic resonance images of the plurality of k-space data can be better suppressed.

For example, if 5 imaging sequences are used, and a first imaging sequence is as shown in FIG. 3 (in FIG. 3, the pre-phase-dispersion gradient pulse 240 has an initial area $A_1$ in which a standard area difference $A_2$ is indicated by a dashed line), for the second to fifth imaging sequences, the areas of pre-phase-dispersion gradient pulses may respectively be $A_1+A_2`A_1+2A_2`A_1+3A_2`A_1+4A_2$, or may respectively be $A_1-A_2`A_1-2A_2`A_1-3A_2`A_1-4A_2$. In the foregoing example, for the first imaging sequence, there is a second imaging sequence whose area difference of the pre-phase-dispersion gradient pulse from that of the first imaging sequence is $A_2$ or $-A_2$. For the second imaging sequence, there is a third imaging sequence whose area difference of the pre-phase-dispersion gradient pulse from that of the second imaging sequence is $A_2$ or $-A_2$, and so on. The aforementioned first to fifth imaging sequences are not necessarily executed sequentially in order. For example, the imaging sequences may be executed in an order of the second, fifth, first, fourth, and third imaging sequences, or may be executed in an order of any other combination.

In an embodiment, the standard area difference described above is 2/N of an area of any phase encoding gradient pulse, where N is the number of the plurality of imaging sequences. Assuming that the area of the phase encoding gradient pulse is $A_3$, using an example in which there are 5 imaging sequences, the standard area difference is $$A_2 = \frac{2A_3}{5}.$$

If an area of a pre-phase-dispersion gradient pulse of the first imaging sequence is $A_1$, the areas of pre-phase-dispersion gradient pulses of the second to fifth imaging sequences respectively are $$A_1 + \frac{2A_3}{5}, A_1 + \frac{4A_3}{5}, A_1 + \frac{6A_3}{5}, \text{ and } A_1 + \frac{8A_3}{5}.$$

Because the area of the pre-phase-dispersion gradient pulse 240 affects phases of a plurality of gradient echoes in a corresponding sequence, a k-space phase encoding line is also shifted as a whole.

Figure 4:
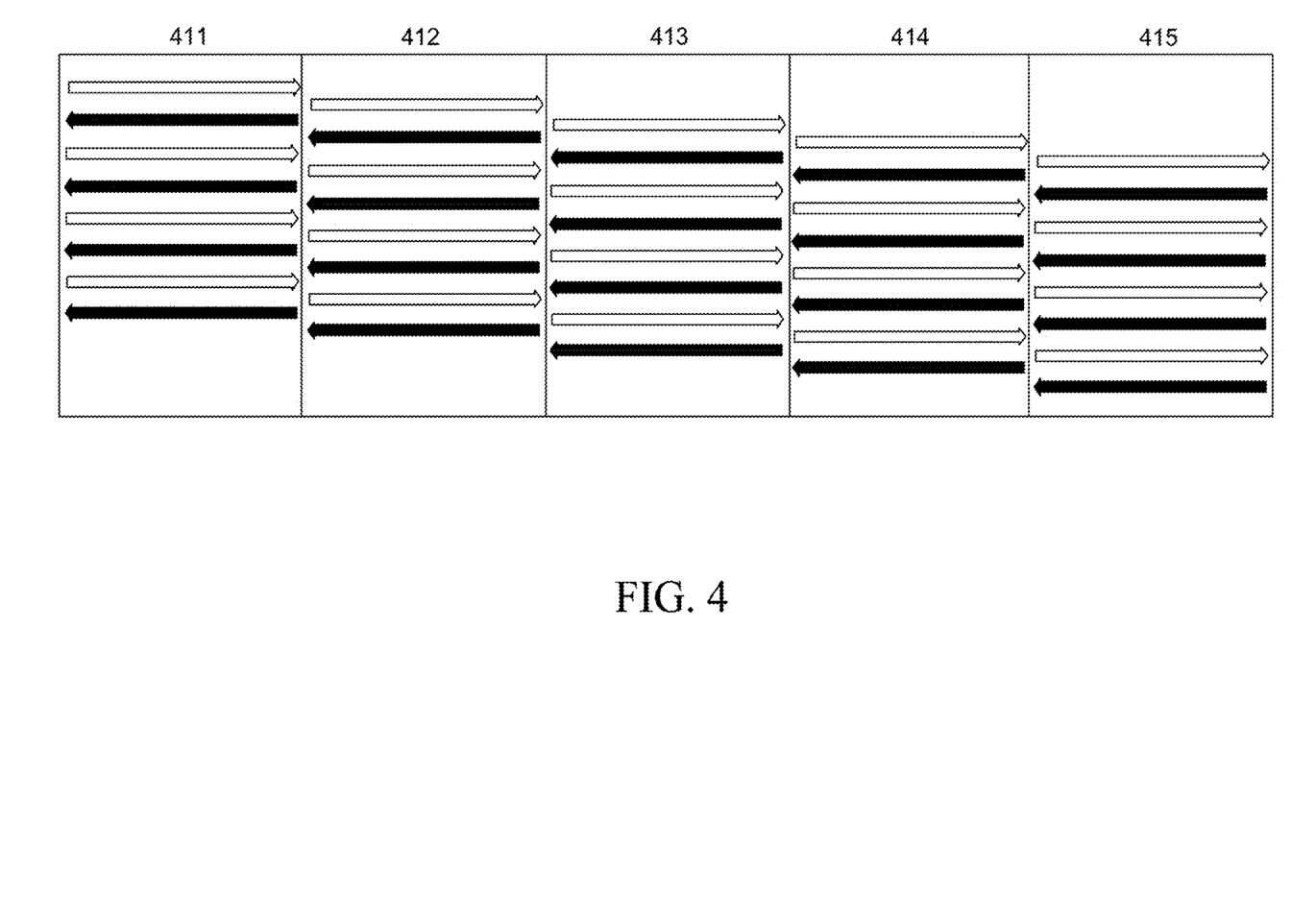
FIG. 4 is a schematic diagram of a k-space data acquisition trajectory obtained according to an exemplary embodiment of the present invention.

FIG. 4 shows a schematic diagram of a k-space data acquisition trajectory according to the pulse sequence in FIG. 2. A k-space data set 411 is first acquired along a lowest line in the presence of a frequency encoding gradient pulse 251. When a spike 242 is applied, a k-space data set 412 is acquired along a second lowest line in the presence of a frequency encoding gradient pulse gradient 252, and so on. When the spike 242 is applied, more k-space data sets are respectively obtained in the presence of the frequency encoding gradient pulse gradient 252. Each spike adds constant phase encoding to a previous spike, to form a regular path through the k-space. An amplitude of the frequency encoding gradient pulse is generally large such that a suitable value can be quickly sampled and an entire data set can be collected within a single free induction decay (FID).

Referring to FIG. 2 again, as described above, a plurality of k-space data sets are acquired by using a plurality of (e.g., 5) imaging sequences that are slightly different. In the first imaging sequence, the pre-phase-dispersion gradient pulse 240 has an initial area $A_1$, k-space data is acquired through the first imaging sequence, and an exemplary schematic diagram of a k-space data acquisition trajectory is as shown in 411 in FIG. 4. In the second imaging sequence, a standard area difference $A_2$ (for example, $$\frac{2A_3}{5},$$

$A_3$ being the area of the spike 241) is subtracted from (or added to) the initial area $A_1$ of the pre-phase-dispersion gradient pulse 240, and therefore, the k-space data acquisition trajectory corresponding to the second imaging sequence becomes 412 in FIG. 4, where the trajectory as a whole shifts downwards by ⅖ of spacing between adjacent trajectories. The k-space data acquisition trajectory corresponding to the third imaging sequence becomes 413 in FIG. 4, where, compared to 412 in FIG. 4, the trajectory as a whole shifts, again, downwards by ⅖ of spacing between adjacent trajectories. Likewise, k-space data acquisition trajectories 414 and 415 shown in FIG. 4 are obtained through the third to fifth imaging sequences. Image reconstruction is respectively performed based on these k-space data, to generate an average amplitude image of 5 images, which can effectively suppress the Nyquist artifact and the acceleration artifact. A suitable number of k-space data sets and corresponding imaging sequences may be selected based on an effect of artifact suppression.

In some implementations, the reconstruction includes a Fourier transform from the k-space to an image space, as is known in the art. Amplitudes of a plurality of MR images are then averaged (e.g., based on formula (3) below) to generate an average MR image.

$$I = \frac{1}{N}(I_1 + I_2 + I_3 + \ldots + I_N). \tag{3}$$

N is the number of the plurality of imaging sequences, the number of acquired k-space data sets, or the number of times for which the imaging sequence is repeatedly performed, where N is an integer.

Generally, an amplitude of an MR signal is greater than an amplitude of a ghost signal. Likewise, when amplitudes of a plurality of acquired images are averaged, a ghost artifact is attenuated in a signal region, while the amplitude of the MR signal is unchanged.

Figure 5:
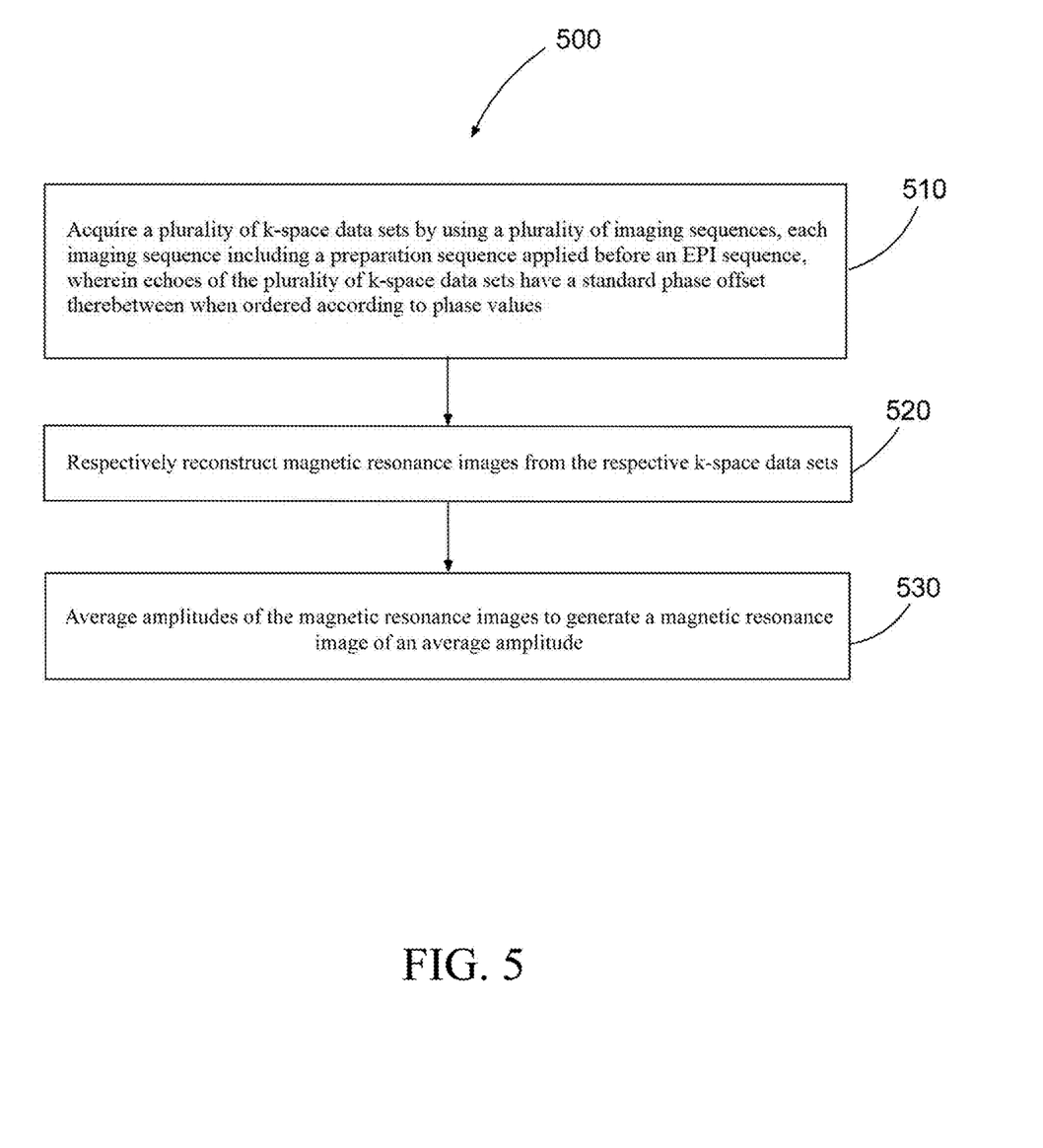
FIG. 5 is a flowchart of a magnetic resonance imaging method according to another exemplary embodiment of the present invention.

FIG. 5 is a flowchart 500 of a magnetic resonance imaging method according to another embodiment of the present invention. The method may be performed by an MRI system (e.g., the MM system 100 in FIG. 1). In step 510, a plurality of k-space data sets is acquired by using a plurality of magnetic resonance imaging sequences respectively. Each imaging sequence includes an echo planar imaging (EPI) sequence and a preparation sequence applied before the EPI sequence, wherein echoes of the plurality of k-space data sets have a standard phase offset therebetween when ordered according to phase values. For example, the plurality of k-space data sets may be similar to the data sets shown in FIG. 3.

The preparation sequence may be similar to the preparation sequence shown in FIG. 2, e.g., may include a pair of diffusion gradient pulses symmetric with the radio-frequency refocusing pulse, and the diffusion gradient pulse includes a phase-shifted gradient pulse and a rephasing gradient pulse. The phase-shifted gradient pulse introduces a phase shift into a proton according to a position of the proton, and the rephasing gradient pulse reverses the change made by the phase-shifted gradient pulse. A phase of a fixed spin is not affected by the diffusion gradient pulse because any phase accumulation from the phase-shifted gradient pulse is reversed by the rephasing gradient pulse. If the proton is moved, the rephasing gradient pulse cannot fully eliminate the phase shift caused by the phase-shifted gradient pulse, and there is signal attenuation. A diffusion weighting may be controlled by adjusting configuration of the diffusion gradient (e.g., intensity, duration, and spacing). The preparation sequence may also have other variants, for example, may also use a sequence such as a separate GRE, SE, DWI, or any combination thereof.

A readout sequence after the preparation sequence may include the EPI sequence. In the EPI sequence, after a pre-scattered gradient, there is a smaller phase encoding gradient pulse at each position where the frequency encoding gradient pulse is reversed, e.g., the "spike". The spike has a constant size and each adds further phase encoding to a previous spike, to form a regular path in the k-space. According to the k-space data acquisition, an even echo and an odd echo are in an opposite direction. For example, if the odd echo (or line) is forward, the even echo (or line) is backward, and vice versa.

Among a plurality of acquisitions, odd and even echoes in a group have a standard phase offset relative to another group. In an embodiment, the standard phase offset is $2\pi/N$, N is the number of the k-space data sets, where N may be greater than 2. Using the foregoing five k-space data acquisitions as example, in a first k-space data set, a k-space data acquisition trajectory has an initial phase, and in a second k-space data set, the trajectory is shifted as a whole by ⅖ of spacing between odd and even trajectories, i.e. the phase is shifted by $2\pi/5$. In a third k-space data set, the trajectory is shifted as a whole by ⅖ of spacing between odd and even trajectories again, the phase is shifted by $4\pi/5$ relative to the initial phase, and so on. In a fourth k-space data set, the phase is shifted by $6\pi/5$ relative to the initial phase, and in a fifth k-space data set, the phase is shifted by $8\pi/5$ relative to the initial phase.

In step 520, MR images are reconstructed from each of the k-space data sets after the plurality of k-space data are acquired according to the plurality of imaging sequences. In some implementations, the reconstruction includes a Fourier transform from the k-space to an image space, as is known in the art.

In step 530, amplitudes of the plurality of MR images are averaged to generate an MR image of an average amplitude. A ghost artifact in a signal region is attenuated and suppressed by averaging a plurality of acquired amplitudes.

Figure 6:
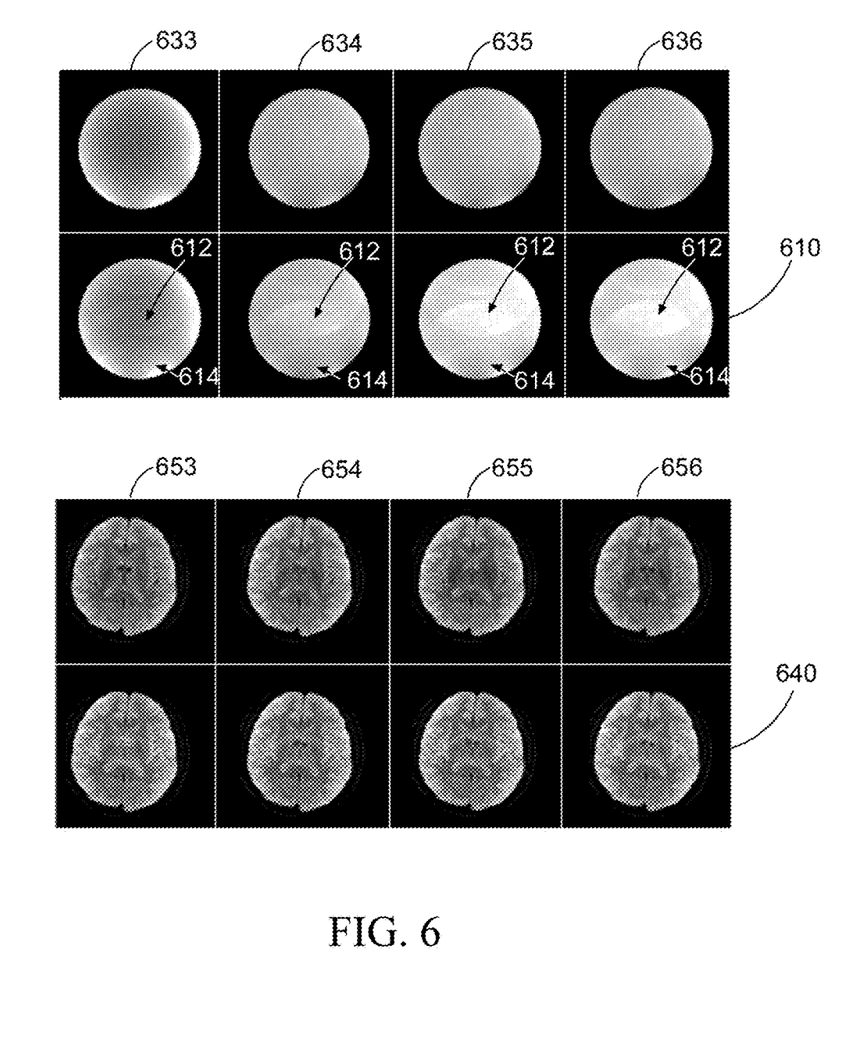
FIG. 6 is a comparison between an image obtained according to a method of an exemplary embodiment of the present invention and an image obtained through a conventional method.

According to an exemplary implementation, FIG. 6 is a comparison between an image obtained by a method disclosed herein and an image obtained by a conventional method. An image 610 is acquired by using the conventional method, wherein a Nyquist ghost 612 and an acceleration artifact 614 are clearly visible in the image. As a comparison, images 633, 634, 635, and 636 are acquired by using the method according to the embodiments of the present invention, and 3, 4, 5 and 6 imaging sequences are respectively used to obtain 3, 4, 5 and 6 k-space data sets. It can be seen that both the Nyquist ghost and acceleration artifact are both effectively suppressed. An image 640 is an axial brain image of a volunteer acquired by using the conventional method, in which the Nyquist ghost and acceleration artifact are clearly visible in the image. As a comparison, images 653, 654, 655, and 656 are axial brain images of the same volunteer acquired by using the method according to the embodiments of the present invention, in which 3, 4, 5 and 6 imaging sequences are respectively used to obtain 3, 4, 5 and 6 k-space data sets. It can be seen that both the Nyquist and acceleration artifacts are substantially suppressed.

Exemplary embodiments of the present invention may also provide a computer-readable storage medium including a stored computer program, wherein the magnetic resonance imaging method in any of the aforementioned embodiments is executed when the computer program is run.

On the basis of the above description, an exemplary embodiment of the present invention may further provide a magnetic resonance imaging (MRI) system, including: a gradient coil, configured to generate an encoding gradient; a radio frequency (RF) coil, configured to generate an RF pulse; and a processor, connected to the gradient coil and the RF coil. The processor is configured to perform the magnetic resonance imaging method according to any one of the foregoing embodiments. For example, the processor is configured to instruct the gradient coil and the RF coil to generate a plurality of imaging sequences to acquire a plurality of k-space data sets, reconstruct magnetic resonance images from the respective k-space data sets respectively, and average amplitudes of the magnetic resonance images to generate a magnetic resonance image of an average amplitude. Each of the plurality of imaging sequences includes a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values.

In addition to any previously indicated modifications, many other variations and alternative arrangements may be designed by those skilled in the art without departing from the spirit and scope of the description, and the appended claims are intended to cover such modifications and arrangements. Therefore, although the information has been specifically described in detail above with reference to the most practical and the most preferred aspects presently considered, it will be apparent for those of ordinary skill in the art that many modifications may be made without departing from the principles and concepts set forth herein, including but not limited to form, function, operating methods, and use. Likewise, as used herein, in all aspects, examples and implementations are intended to be illustrative only and should not be interpreted in any way as limiting.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A magnetic resonance imaging method, comprising:
acquiring a plurality of k-space data sets by using a plurality of imaging sequences, each imaging sequence comprising a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values;
respectively reconstructing magnetic resonance images from the respective k-space data sets; and
averaging amplitudes of the magnetic resonance images to generate a magnetic resonance image of an average amplitude.

2. The method according to claim 1, wherein the standard area difference is 2/N of the area of any phase encoding gradient, where N is the number of the plurality of imaging sequences.

3. The method according to claim 1, wherein the number of the plurality of imaging sequences is greater than 2.

4. The method according to claim 1, wherein each imaging sequence further comprises a radio-frequency excitation pulse, a radio-frequency refocusing pulse, and a diffusion gradient pulse, the diffusion gradient pulse comprises a phase-shifted gradient pulse and a rephasing gradient pulse, the phase-shifted gradient pulse and the rephasing gradient pulse are symmetrically applied before and after the radio-frequency refocusing pulse respectively, and the pre-phase-dispersion gradient pulse is applied after the rephasing gradient pulse.

5. The method according to claim 1, wherein each imaging sequence further comprises a plurality of frequency encoding gradients, directions of the plurality of frequency encoding gradients are alternately reversed, and the plurality of phase encoding gradients are respectively applied when the directions of the plurality of frequency encoding gradients are reversed.

6. A magnetic resonance imaging method, comprising:
acquiring a plurality of k-space data sets by using a plurality of imaging sequences, each imaging sequence comprising an echo planar imaging sequence and a preparation sequence applied before the echo planar imaging sequence, wherein echoes of the plurality of k-space data sets have a standard phase offset therebetween when ordered according to phase values;
respectively reconstructing magnetic resonance images from the respective k-space data sets; and
averaging amplitudes of the magnetic resonance images to generate a magnetic resonance image of an average amplitude.

7. The method according to claim 6, wherein the standard phase offset is $2\pi/N$, where N is the number of the k-space data sets.

8. The method according to claim 6, wherein the number of the k-space data sets is greater than 2.

9. The method according to claim 6, wherein the preparation sequence comprises a spin-echo sequence, a gradient echo sequence, a diffusion-weighted sequence, or a spin-echo diffusion-weighted sequence.

10. A computer-readable storage medium, comprising a stored computer program, wherein the magnetic resonance imaging method according to claim 1 is performed when the computer program is run.

11. A magnetic resonance imaging (MM) system, comprising:
a gradient coil, configured to generate an encoding gradient;
a radio frequency (RF) coil, configured to generate an RF pulse; and
a processor, connected to the gradient coil and the RF coil, and configured to:
instruct the gradient coil and the RF coil to generate a plurality of imaging sequences to acquire a plurality of k-space data sets, each imaging sequence comprising a pre-phase-dispersion gradient pulse and a plurality of phase encoding gradients applied after the pre-phase-dispersion gradient pulse, wherein the pre-phase-dispersion gradient pulses of the plurality of imaging sequences have a standard area difference therebetween when ordered according to area values;
respectively reconstructing magnetic resonance images from the respective k-space data sets; and
averaging amplitudes of the magnetic resonance images to generate a magnetic resonance image of an average amplitude.

12. The system according to claim 11, wherein the standard area difference is 2/N of an area of any phase encoding gradient, where N is the number of the plurality of imaging sequences.

13. The system according to claim 11, wherein echoes of the plurality of k-space data sets have a standard phase offset therebetween when ordered according to phase values.

14. The system according to claim 13, wherein the standard phase offset is $2\pi/N$, where N is the number of the k-space data sets.

* * * * *